US012684724B2

(12) United States Patent　　　(10) Patent No.: US 12,684,724 B2
Kudo et al.　　　　　　　　　　　(45) Date of Patent:　Jul. 14, 2026

(54) IMAGING APPARATUS

(71) Applicant: Panasonic Intellectual Property Management Co., Ltd., Osaka (JP)

(72) Inventors: Yoshiaki Kudo, Osaka (JP); Jun Saiki, Hyogo (JP); Rintaro Wada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 179 days.

(21) Appl. No.: 18/660,458

(22) Filed: May 10, 2024

(65) Prior Publication Data

US 2024/0389256 A1　　Nov. 21, 2024

(30) Foreign Application Priority Data

May 15, 2023　(JP) ................................. 2023-079954

(51) Int. Cl.
　H05K 7/14　　　(2006.01)
　G03B 17/02　　　(2021.01)
(52) U.S. Cl.
　CPC ........... H05K 7/1417 (2013.01); G03B 17/02 (2013.01)
(58) Field of Classification Search
　CPC .............................. H05K 7/1417; G03B 17/02
　See application file for complete search history.

(56) References Cited

U.S. PATENT DOCUMENTS

| | | |
|---|---|---|
| 2014/0086568 A1 | 3/2014 | Nomura et al. |
| 2019/0174623 A1* | 6/2019 | Owaki ................... H04N 23/52 |
| 2019/0312997 A1 | 10/2019 | Fujii |

FOREIGN PATENT DOCUMENTS

| | | |
|---|---|---|
| JP | S60-191789 A | 9/1985 |
| JP | 2012-185246 A | 9/2012 |
| JP | 2014-066771 A | 4/2014 |
| JP | 2019-184740 A | 10/2019 |

OTHER PUBLICATIONS

Office Action dated Jun. 20, 2023 issued on the corresponding JP Patent Appln. No. 2023-079954 with its machine translation.
Office Action dated Sep. 12, 2023 issued on the corresponding JP Patent Appln. No. 2023-079954 with its machine translation.

* cited by examiner

*Primary Examiner* — Minh Q Phan
(74) *Attorney, Agent, or Firm* — Renner, Otto, Boisselle & Sklar, LLP

(57)　　　　ABSTRACT
An imaging apparatus includes: a casing having first and second attachment surfaces; a sheet fixing member having first and second contact surfaces coming into contact with the first and second attachment surfaces, respectively; and a sheet-like member disposed between the casing and the sheet fixing member. The sheet fixing member has a first portion and a second portion that is displaceable with respect to the first portion. The first contact surface of the sheet fixing member is disposed on the first portion. The second contact surface of the sheet fixing member is disposed on the second portion.

6 Claims, 10 Drawing Sheets

IMAGING APPARATUS

BACKGROUND

Technical Field

The present disclosure relates to an imaging apparatus.

Description of the Related Art

For example, JP2019-184740 discloses an imaging apparatus having a wireless communication part holding member with a bending part that is grounded to a metal enclosure and a planar part that is attached to a base member fixed to the metal enclosure.

By the way, in the case where one member (wireless communication part holding member) is brought into contact with and fixed to a plurality of attachment surfaces on the other at least one member (metal enclosure, base member), as in the imaging apparatus described in JP2019-184740, it is necessary to fabricate the plurality of attachment surfaces with high precision. Otherwise, one member and the other member may not make normal contact with each other. Naturally, even though the other member is fabricated with high precision, if one member is not fabricated with high precision, both members may not make proper contact with each other. However, it is extremely difficult to fabricate both members with high precision and without shape variations.

SUMMARY

In view of the above, an object of the present disclosure is to bring a member on one hand into normal contact with a plurality of attachment surfaces on at least one member on the other in an imaging apparatus, even if there are variations in shape.

In order to solve the above problem, according to an aspect of the present disclosure, an imaging apparatus is provided that includes:

a casing having first and second attachment surfaces;

a sheet fixing member having first and second contact surfaces coming into contact with the first and second attachment surfaces, respectively; and a sheet-like member disposed between the casing and the sheet-fixing member, the sheet fixing member including a first portion and a second portion displaceable relative to the first portion, the first contact surface of the sheet fixing member disposed on the first portion, the second contact surface of the sheet fixing member disposed on the second portion.

According to the present disclosure, in an imaging apparatus, a member on one hand can be brought into normal contact with a plurality of attachment surfaces on at least one member on the other, even if there are variations in shape.

DETAILED DESCRIPTION

An embodiment will now be described in detail with reference to the drawings as appropriate. However, more detailed description than necessary may be omitted. For example, detailed description of already well-known matters and duplicate description for substantially the same configuration may be omitted. This is to avoid unnecessary redundancy in the following description and to facilitate the understanding of those skilled in the art.

It should be noted that the inventor(s) provide the accompanying drawings and the following description in order that those skilled in the art fully understand the present disclosure, but do not intend to thereby limit the subject matter defined in the claims.

An imaging apparatus according to the embodiment of the present disclosure will hereinafter be described with reference to the drawings.

Figure 1:
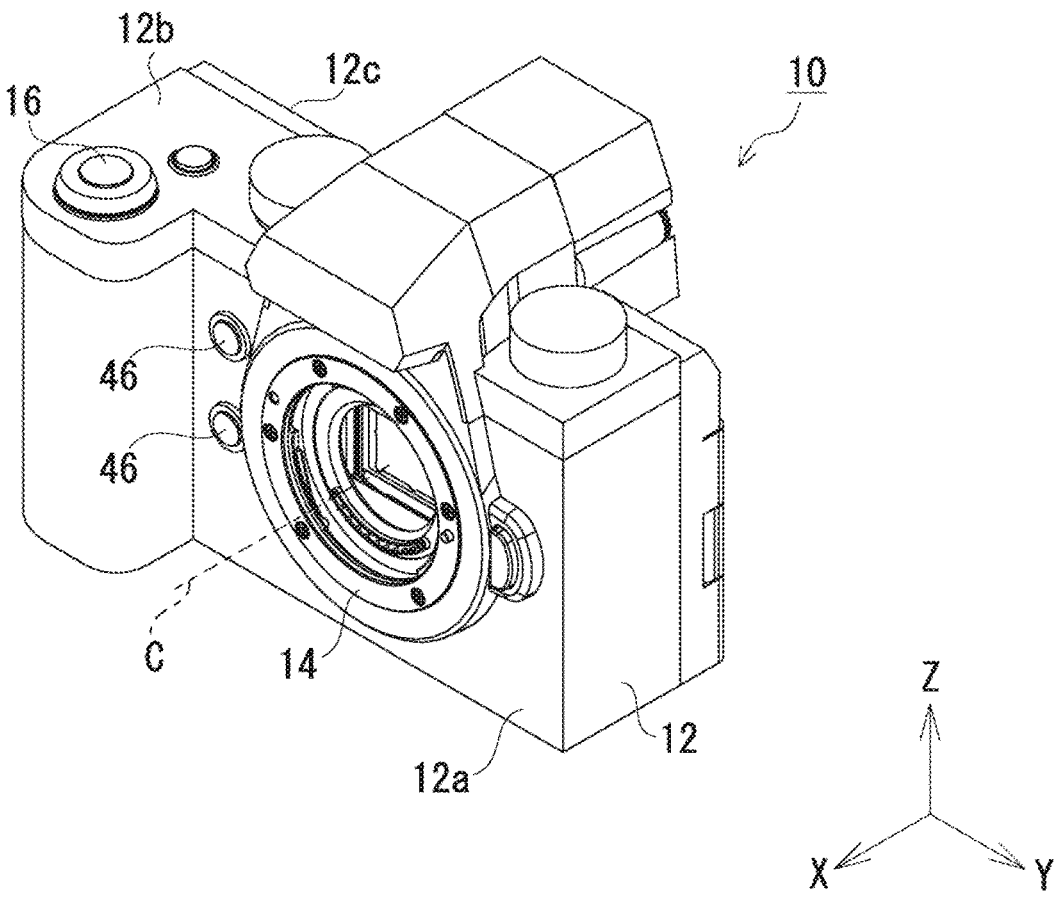
FIG. 1 is a perspective view of an imaging apparatus according to one embodiment of the present disclosure.
Figure 2:
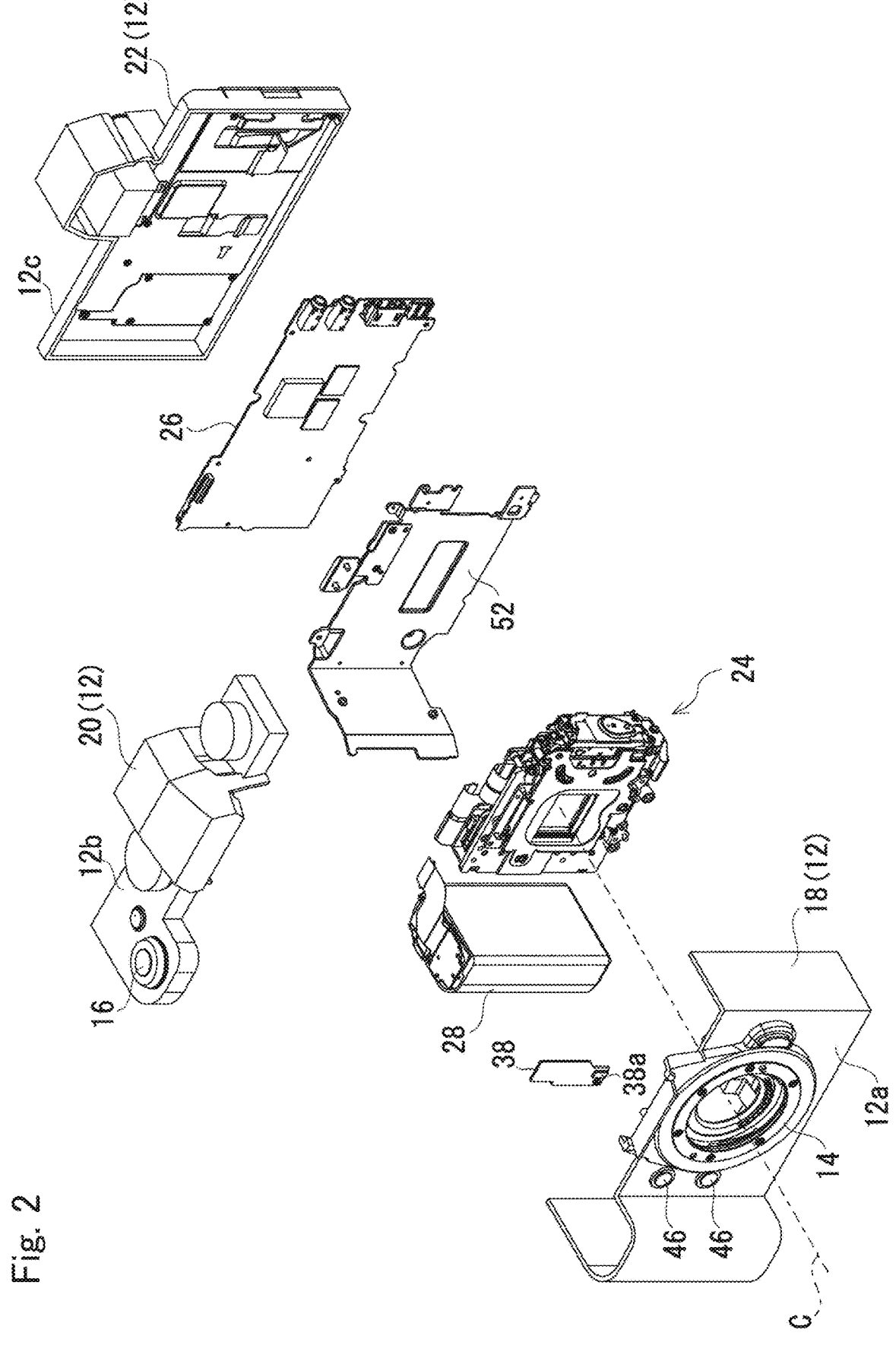
FIG. 2 is an exploded perspective view of the imaging apparatus.
Figure 3:
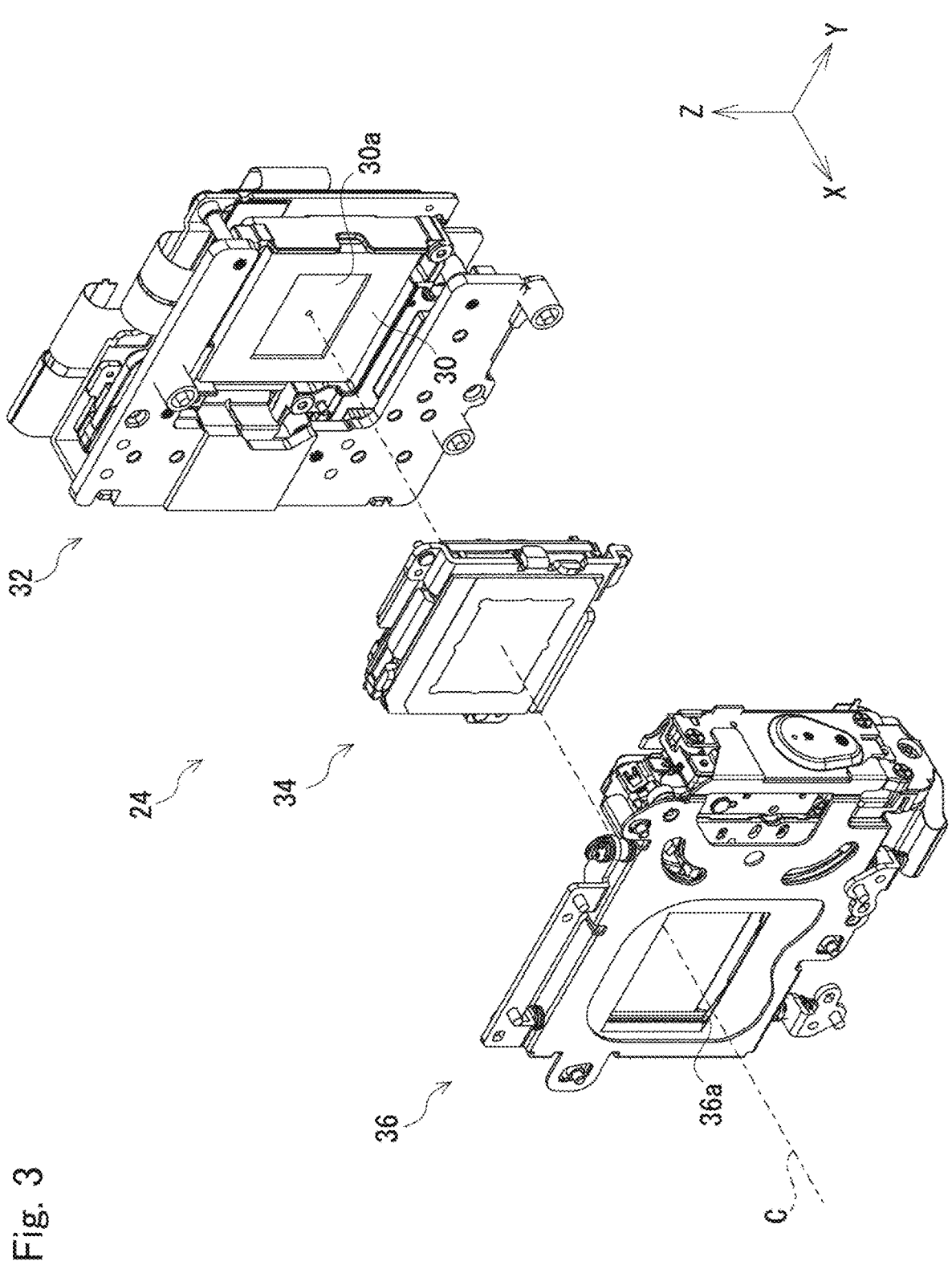
FIG. 3 is an exploded perspective view of an imaging unit.

FIG. 1 is a perspective view of the imaging apparatus according to the embodiment of the present disclosure. FIG. 2 is an exploded perspective view of the imaging apparatus. FIG. 3 is an exploded perspective view of an imaging unit.

Note that the X-Y-Z orthogonal coordinate system shown in the figures is intended to facilitate understanding of the embodiment of the present disclosure, but does not limit the embodiment of the present disclosure. The X-axis direction is the front-back direction of the imaging apparatus, the Y-axis direction is the left-right direction, and the Z-axis direction is the height direction. The side where the subject exists when photographing is the front side of the imaging apparatus, and the right and left sides of the imaging apparatus are the right and left sides (in front view) when the imaging apparatus is viewed from the front.

As shown in FIGS. 1 to 3, an imaging apparatus 10 according to this embodiment includes a housing 12. The housing 12 has on its front surface 12a a lens mount 14 to which a lens (not shown) is removably attached. The housing 12 has a shutter button 16 disposed on its top surface 12b.

As shown in FIG. 2, in the case of this embodiment, the housing 12 of the imaging apparatus 10 includes: a front casing 18 having the lens mount 14 and including the front surface 12a of the housing 12; a top casing 20 having the shutter button 16 and including the top surface 12b of the housing 12, and a rear casing 22 including a rear surface 12c of the housing 12.

As shown in FIGS. 2 and 3, the housing 12 accommodates therein: an imaging unit 24 that converts a subject image passing through the lens attached to the lens mount 14 into image data; a control board 26 that controls the imaging unit 24 and so forth; and a battery unit 28 that supplies power to the imaging unit 24, the control board 26, etc.

As shown in FIG. 3, the imaging unit 24 includes an imaging element 30 that converts an image of a subject into image data. The imaging element 30 includes a light-receiving surface 30a on which the subject image passing through the lens attached to the lens mount 14 is incident.

The imaging unit 24 includes a hand-shake compensation unit 32 that displaces the imaging element 30 in the left-right (Y-axis) and height (Z-axis) directions of the imaging apparatus 10.

The hand-shake compensation unit 32 is a unit for suppressing image blur caused by vibrations transmitted from the user's hand to the imaging apparatus 10. To this end, the hand-shake compensation unit 32 is configured to displace the imaging element 30 in two directions (left-right direction (Y-axis direction) and height direction (Z-axis direction)) orthogonal to the direction (front-back direction (X-axis direction)) of extension of the optical axis C orthogonal to the light-receiving surface 30a. Specifically, image blur is suppressed by the hand-shake compensation unit 32 displacing the imaging element 30 in a direction opposite to the direction in which the housing 12 of the imaging apparatus 10 is displaced.

The imaging unit 24 further includes a filter unit 34 that is positioned in front of the light-receiving surface 30a of the imaging element 30 and that includes a plurality of filters, such as an infrared filter cutting infrared rays contained in light from a subject and a protective glass protecting the light-receiving surface 30a.

The imaging unit 24 further includes a shutter unit 36 that is positioned in front of the filter unit 34 and that adjusts the exposure time. When the shutter button 16 is pressed, a shutter 36a in the shutter unit 36 closes, blocking light directed toward the light-receiving surface 30a of the imaging element 30. The imaging unit 24 is fixed to the front casing 18 via the shutter unit 36.

In the case of this embodiment, as shown in FIG. 2, a wireless communication unit 38 is mounted within the housing 12. The wireless communication unit 38 is arranged between the front casing 18 and the battery unit 28. This wireless communication unit 38 is a unit that performs wireless communication with an external apparatus. The wireless communication unit 38 is, for example, a unit that performs wireless communication conforming to the Wi-Fi standard.

The wireless communication unit 38 is connected to the control board 26 via a flexible circuit board (sheet-like member).

Figure 4:
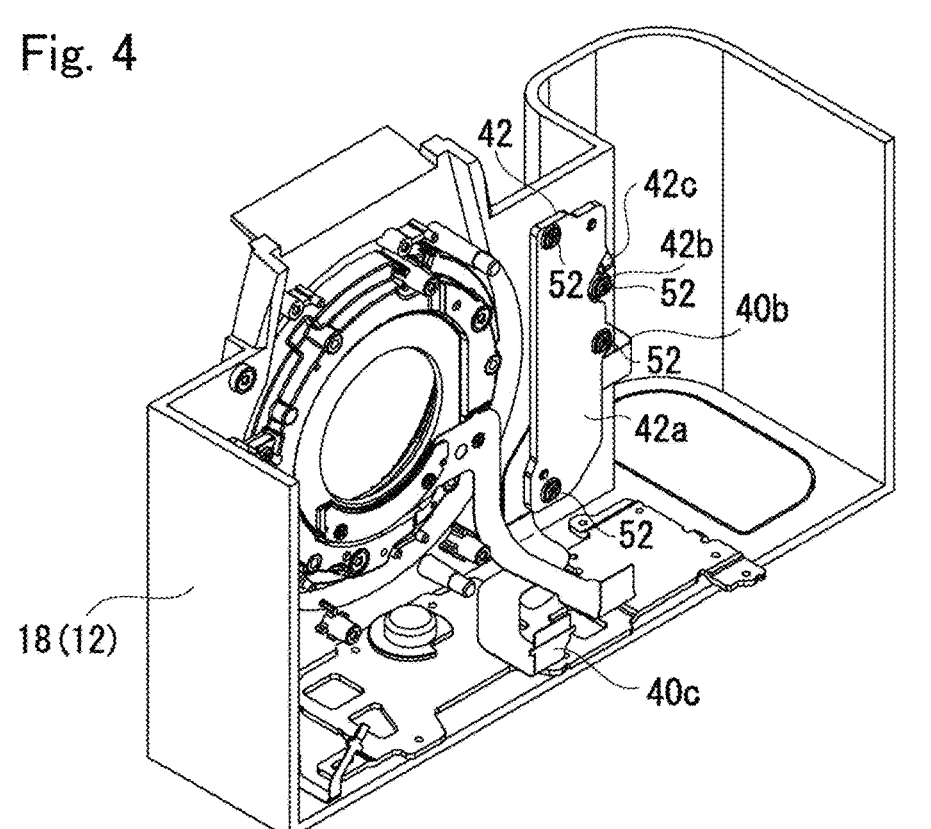
FIG. 4 is a rear perspective view of a front casing.
Figure 4:
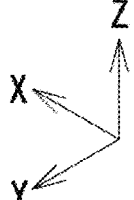
Figure 5:
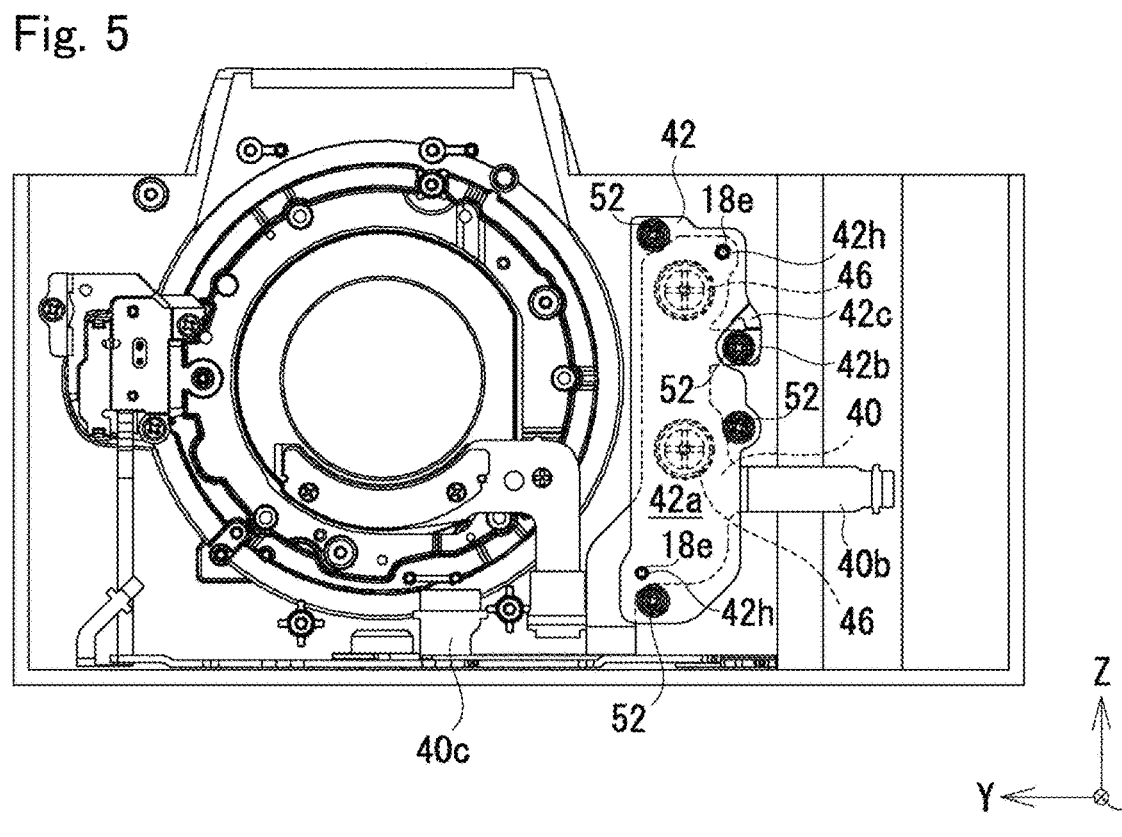
FIG. 5 is a rear view of the front casing.
Figure 6:
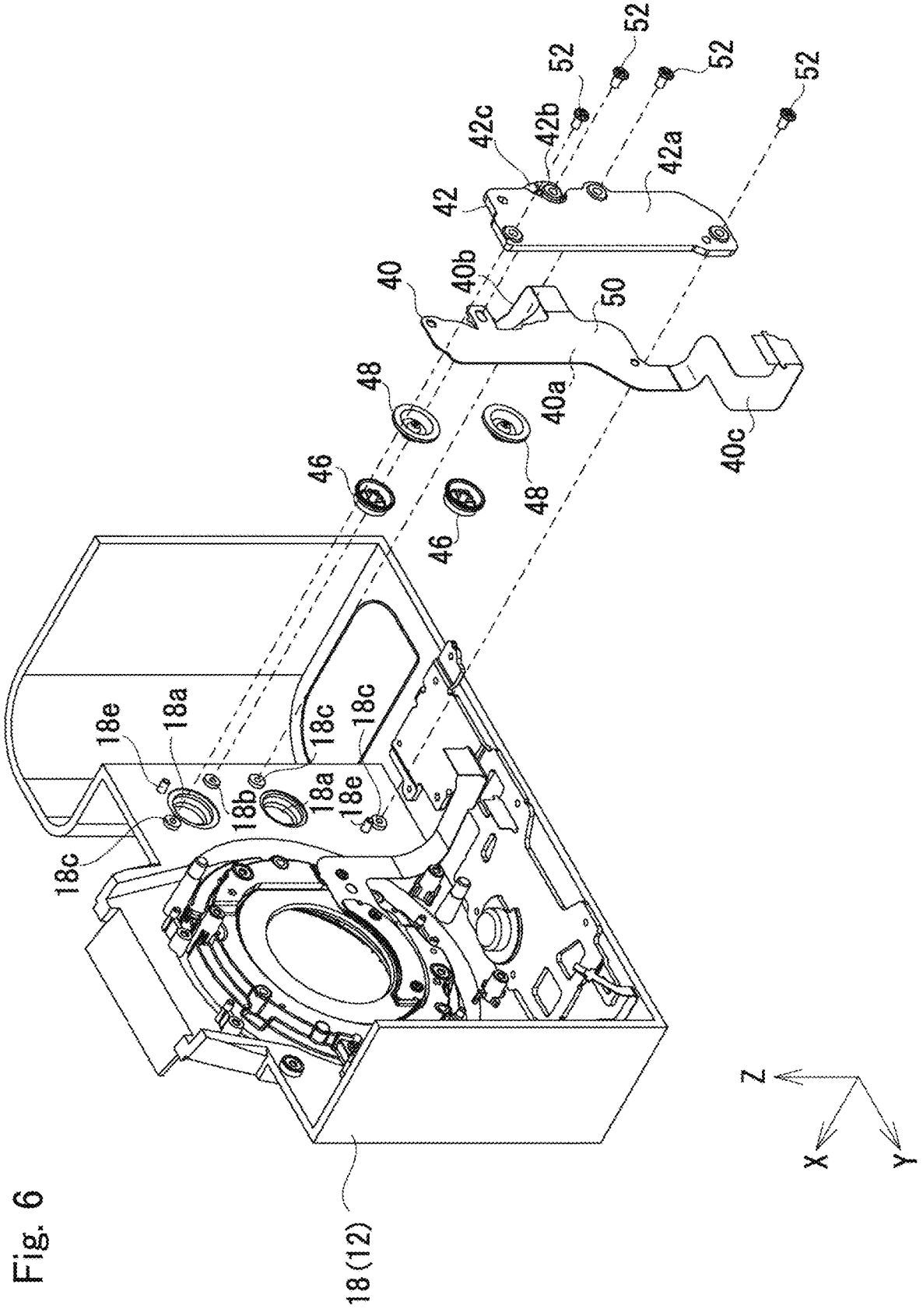
FIG. 6 is a rear exploded perspective views of components attached to the front casing.
Figure 7:
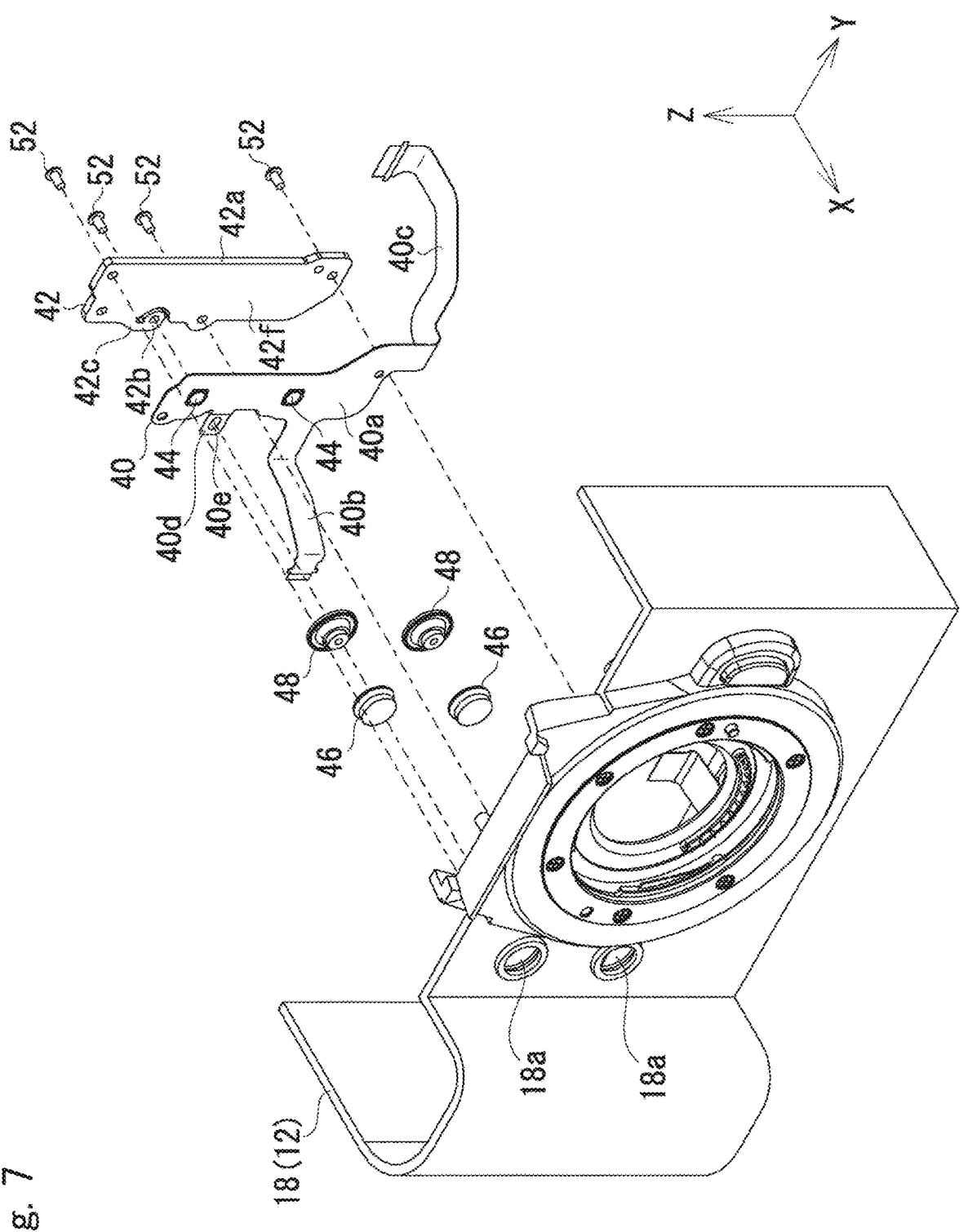
FIG. 7 is a front exploded perspective views of the components attached to the front casing.
Figure 8:
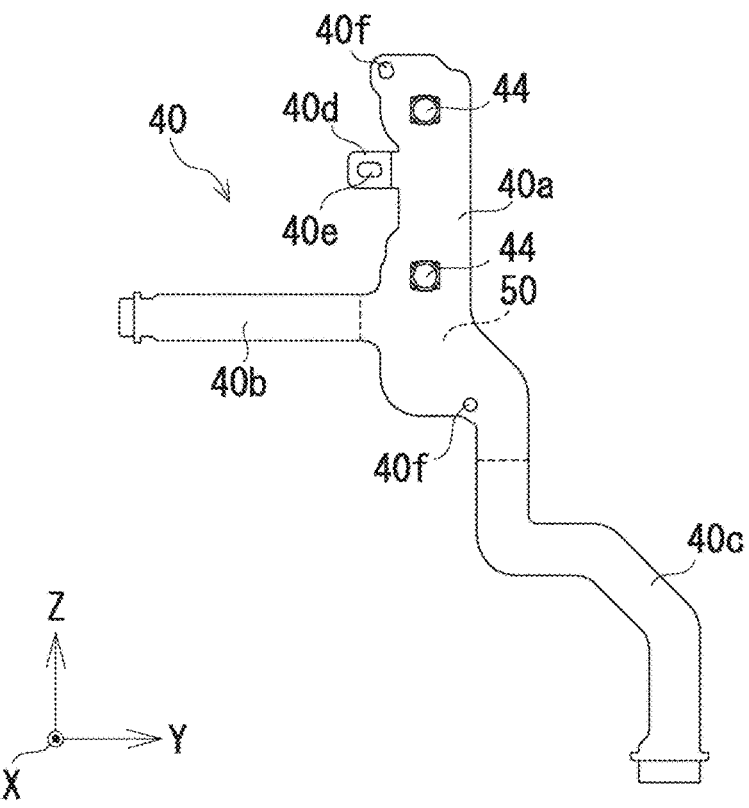
FIG. 8 is a front view of a flexible circuit board in an unfolded state.
Figure 9:
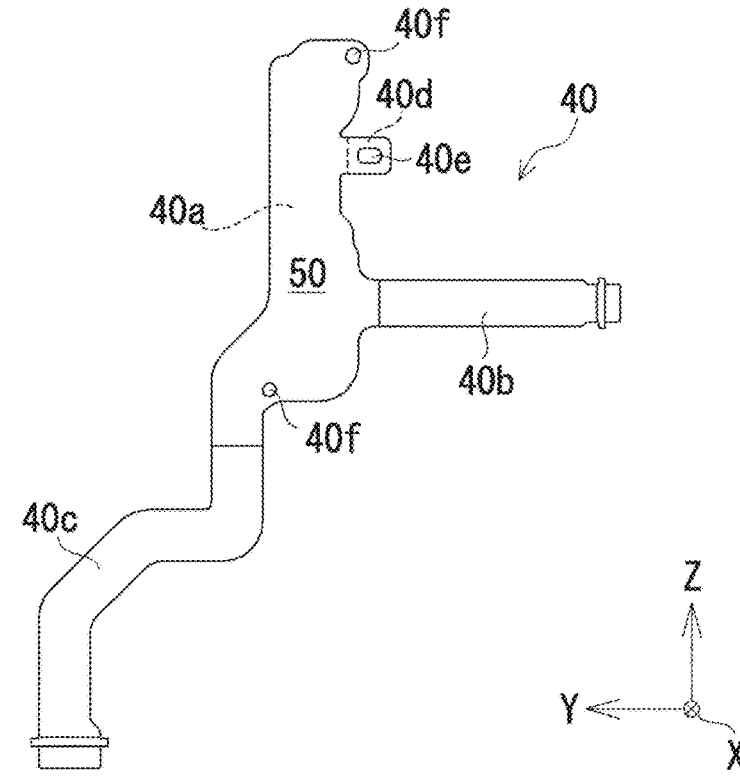
FIG. 9 is a rear view of the flexible circuit board in the unfolded state.
Figure 10:
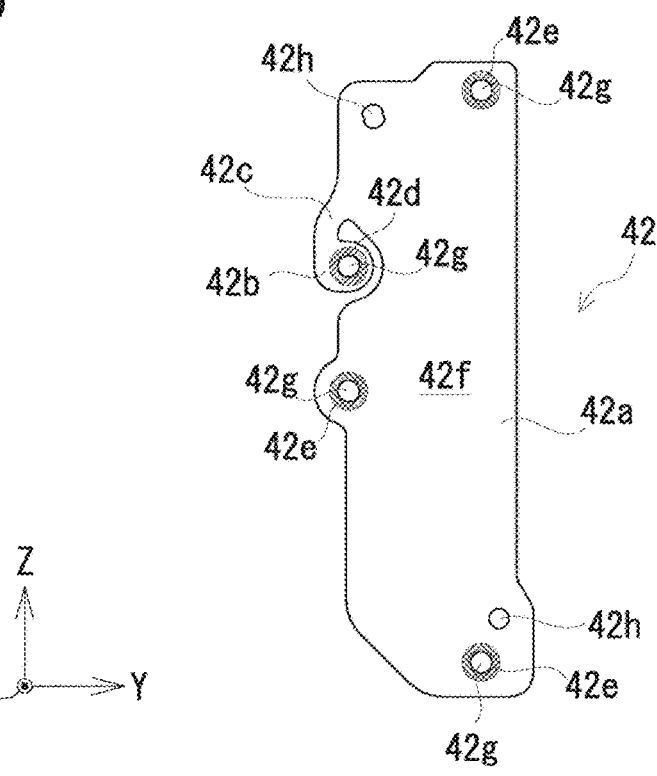
FIG. 10 is a front view of a sheet fixing member.
Figure 11:
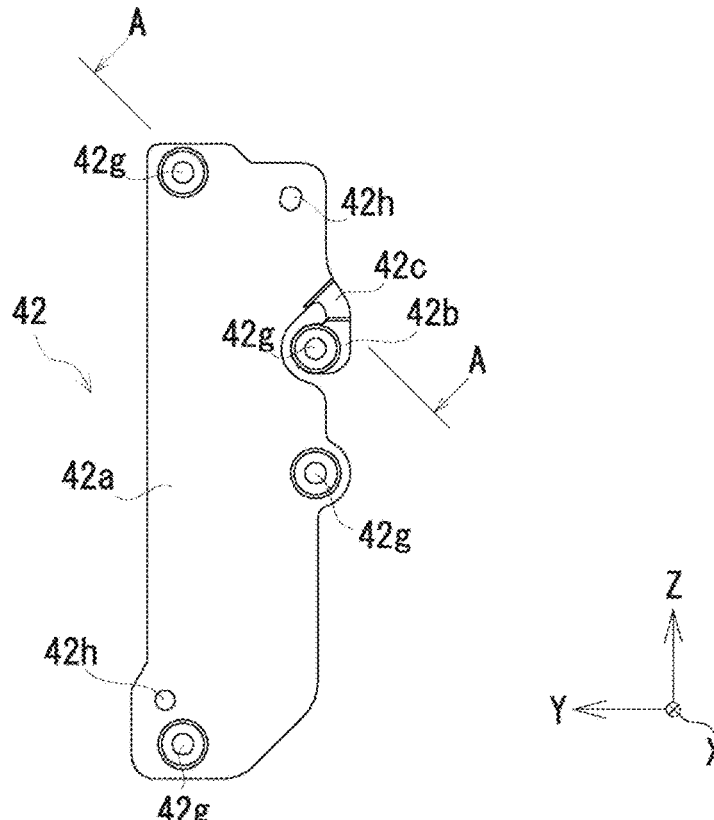
FIG. 11 is a rear view of the sheet fixing member.

FIG. 4 is a rear perspective view of the front casing. FIG. 5 is a rear view of the front casing. FIGS. 6 and 7 are rear and front exploded perspective views, respectively, of components attached to the front casing. FIGS. 8 and 9 are a front view and a rear view, respectively, of the flexible circuit board in an unfolded state. FIGS. 10 and 11 are a front view and a rear view, respectively, of a sheet fixing member for fixing the flexible circuit board to the front casing.

As shown in FIGS. 4 and 5, a flexible circuit board 40 is fixed to the rear surface of the front casing 18 via a sheet fixing member 42.

The flexible circuit board 40 is a flexible sheet-like member having a base film and a cover film overlapping the base film, wherein a conductor pattern fabricated from a conductor such as copper is disposed between the base film and the cover film.

In the case of this embodiment, as shown in FIGS. 8 and 9, the flexible circuit board 40 includes a body portion 40a and two cable portions 40b and 40c extending from the body portion 40a. The cable portion 40b on one hand is connected to a connector 38a of the wireless communication unit 38 shown in FIG. 2. The cable portion 40c on the other is connected to the control board 26. The wireless communication unit 38 and the control board 26 are thus electrically connected via the flexible circuit board 40.

In the case of this embodiment, as shown in FIGS. 7 and 8, the body portion 40a of the flexible circuit board 40 has a plurality of tact switches 44 mounted on. That is, the conductor pattern of the flexible circuit board 40 includes a wiring pattern electrically connecting the wireless communication unit 38 to the control board 26 and a wiring pattern connecting the plurality of tact switches 44 to the control board 26.

As shown in FIGS. 6 and 7, an operation button 46 and a packing 48 are disposed in front of each of the plurality of tact switches 44. The operation button 46 is housed in a through hole 18a formed in the front casing 18 so as to be movable back and forth in the front-rear direction (X-axis direction). The packing 48 covers the through hole 18a to prevent foreign matter such as liquid from entering the housing 12 through the through hole 18a. When the operation button 46 is pressed by the user, the retracted operation button 46 presses the tact switch 44 via the packing 48.

In the case of this embodiment, the body portion 40a of the flexible circuit board 40 has a grounding terminal 40d for grounding the wireless communication unit 38. The grounding terminal 40d is a portion of the conductor pattern exposed by removing the cover film. The ground terminal 40d is electrically connected to the wireless communication unit 38 via a ground wire (not shown) in the cable portion 40b. By being grounded (electrically connected) to the front casing 18 via the grounding terminal 40d of the flexible circuit board 40, the wireless communication unit 38 can perform wireless communication with reduced noise effects.

In the case of this embodiment, as shown in FIGS. 6 and 9, the body portion 40a of the flexible circuit board 40 has on its rear surface a reinforcing plate 50 attached thereto. The reinforcing plate 50 has a thickness greater than that of the flexible circuit board 40 and is fabricated from, for example, polyimide resin. For example, the flexible circuit board 40 has a thickness of approx. 0.1 mm, while the reinforcing plate 50 has a thickness of approx. 0.3 mm. The cable portions 40b and 40c of the flexible circuit board 40 are not attached to the reinforcing plate 50 in order to ensure flexibility.

As shown in FIGS. 4 to 7, the body portion 40a of the flexible circuit board 40 is disposed between the front casing 18 and the sheet fixing member 42 and is fixed to the front casing 18 by the sheet fixing member 42.

FIGS. 10 and 11 are a front view and a rear view, respectively, of the sheet fixing member.

The sheet fixing member 42 is a plate-shaped member fabricated from, for example, a flexible resin material. As shown in FIGS. 10 and 11, the sheet fixing member 42 includes a first portion 42a and a second portion 42b elastically displaceable in the front-rear direction (X-axis direction) of the imaging apparatus 10 relative to the first portion 42a.

Specifically, the first portion 42a of the sheet fixing member 42 occupies most of the sheet fixing member 42. The second portion 42b is spaced apart from the first portion 42a and is connected to the first portion 42a via a connecting portion 42c. In the case of this embodiment, the connecting portion 42c has one end connected to the first portion 42a and the other end connected to the second portion 42b. The second portion 42b is displaced with respect to the first portion 42a by deflection deformation of this connecting portion 42c.

Figure 12:
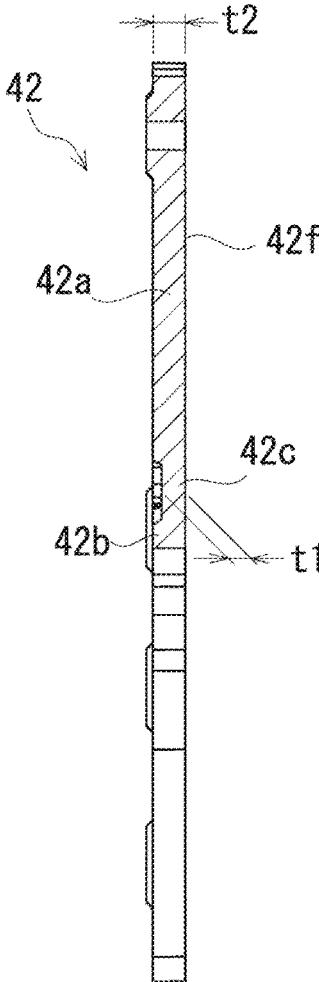
FIG. 12 is a cross-sectional view of the sheet fixing member taken along line A-A shown in FIG. 11.

FIG. 12 is a cross-sectional view of the sheet fixing member taken along line A-A shown in FIG. 11.

As shown in FIG. 12, in the sheet fixing member 42, the connecting portion 42c has a thickness t1 smaller than a thickness t2 of the first portion 42a and the second portion 42b. Specifically, in size in the direction (X-axis direction) where the front casing 18 and the sheet fixing member 42 face each other, the connecting portion 42c is smaller than the first portion 42a and the second portion 42b. As a result, the connecting portion 42c is more easily deflected and deformed than the first portion 42a and the second portion 42b. By being connected to the first portion 42a via such a connecting portion 42c, the second portion 42b is easily displaced with respect to the first portion 42a.

From here on, the reason will be described why the sheet fixing member 42 has the second portion 42b that is displaceable (i.e., easy to displace) with respect to the first portion 42a.

First, the front casing 18 has on its rear surface a plurality of attachment surfaces that come into contact with the sheet fixing member 42.

Figure 13:
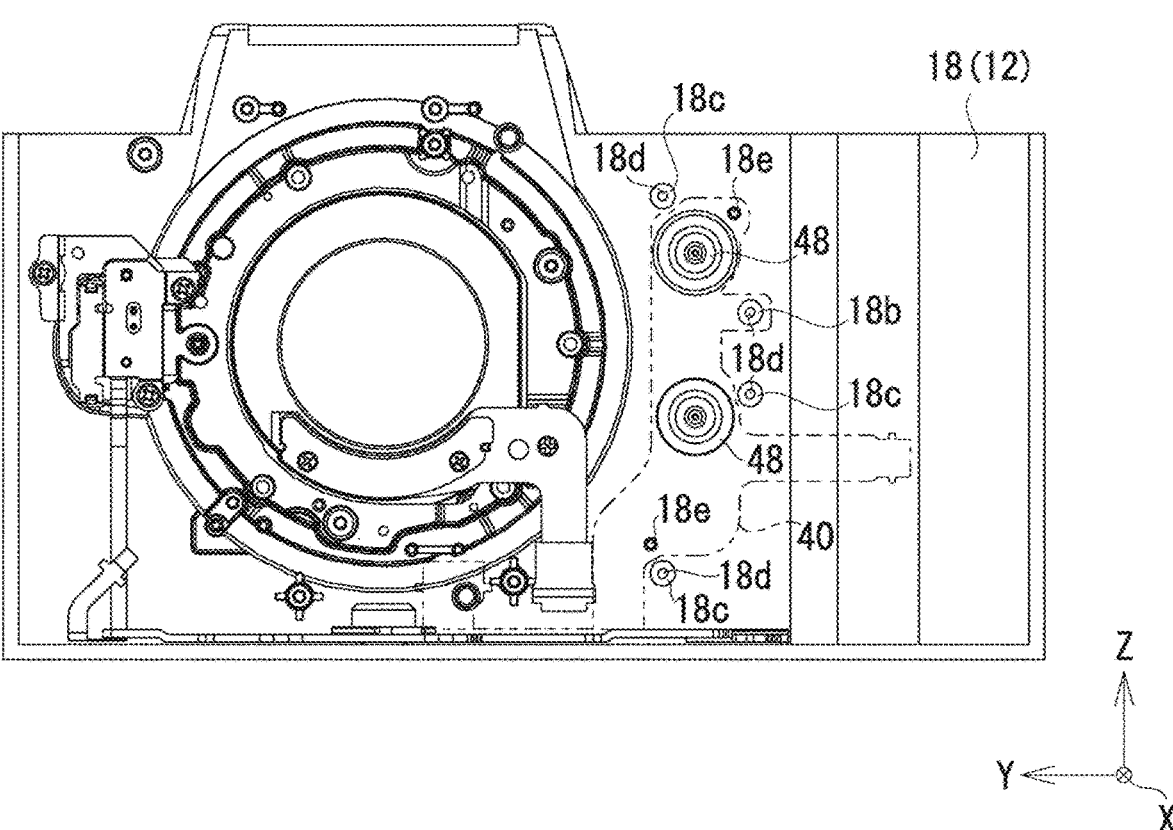
FIG. 13 is a rear view of the front casing showing a plurality of attachment surfaces.

FIG. 13 is a rear view of the front casing showing a plurality of attachment surfaces with which the sheet fixing member is in contact.

As shown in FIGS. 6 and 13, first, the front casing 18 includes an attachment surface 18b (second attachment surface) that is the top surface of a bossed portion that projects rearward. The flexible circuit board 40 is supported on the attachment surface 18b. Specifically, the grounding terminal 40d of the flexible circuit board 40 is in contact with and supported by the attachment surface 18b. This allows the grounding terminal 40d of the flexible circuit board 40 to be electrically connected to the front casing 18. The flexible circuit board 40 is supported also by a plurality of the packings 48 shown in FIGS. 6 and 7.

As shown in FIGS. 6 and 13, the sheet fixing member 42 comes into contact with attachment surfaces 18c (first attachment surfaces) that are the top surfaces of a plurality of bossed portions formed on the front casing 18 and protruding rearward. The sheet fixing member 42 is in contact also with the attachment surface 18b supporting the flexible circuit board 40. That is, the sheet fixing member 42 is in indirect contact with the attachment surface 18b via the grounding terminal 40d of the flexible circuit board 40 and is in direct contact with the remaining attachment surfaces 18c. In FIG. 10, cross-hatching designates a contact surface 42d (second contact surface) that is in contact with the attachment surface 18b and contact surfaces 42e (first contact surfaces) that are in contact with the attachment surfaces 18c. The contact surface 42d is disposed on the second portion 42b, while the remaining contact surfaces 42e are disposed on the first portion 42a.

As shown in FIGS. 7, 10, and 12, in the case of this embodiment, the sheet fixing member 42 has a planar sheet support surface 42f that is in contact with and supports the body portion 40a of the flexible circuit board 40. As a result, the body portion 40a of the flexible circuit board 40 is maintained without displacement even when the tact switch 44 is pressed by the operation button 46 retracted by the user's operation. In the case of this embodiment, the sheet support surface 42f and the plurality of contact surfaces 42d and 42e lie on the same plane.

In the case of this embodiment, the sheet fixing member 42 is fixed to the front casing 18 via a plurality of fixing screws 52, as shown in FIGS. 5 to 7. Specifically, as shown in FIG. 13, the plurality of attachment surfaces 18b and 18c of the front casing 18 are each formed with a threaded hole 18d that engages with the fixing screw 52. As shown in FIGS. 8 and 9, a through hole 40e through which the fixing screw 52 passes is formed in the grounding terminal 40d of the flexible circuit board 40 that comes into contact with the attachment surface 18b of the front casing 18. Furthermore, as shown in FIGS. 10 and 11, a through hole 42g through which the fixing screw 52 passes is formed in each of the plurality of contact surfaces 42d and 42e of the sheet fixing member 42 that come into contact with the plurality of attachment surfaces 18b and 18c, respectively, of the front casing 18. The sheet fixing member 42 is fixed to the front casing 18 by the fixing screw 52 passing through the through hole 42g of the sheet fixing member 42 and the through hole 40e of the flexible circuit board 40 to engage with the threaded hole 18d of the front casing 18. As a result, the flexible circuit board 40 is fixed to the front casing 18.

Furthermore, in the case of this embodiment, the flexible circuit board 40 and the sheet fixing member 42 are attached to the front casing 18, positioned relative thereto. To this end, as shown in FIGS. 6 and 13, the front casing 18 includes a plurality of positioning pins 18e that protrude rearward. As shown in FIGS. 8 and 9, the flexible circuit board 40 includes positioning through holes 40f that engage with the positioning pins 18e. Similarly, as shown in FIGS. 10 and 11, the sheet fixing member 42 also includes positioning through holes 42h that engage with the positioning pins 18e.

According to such a sheet fixing member 42, the flexible circuit board 40 and the sheet fixing member 42 can be fixed normally relative to the front casing 18 even if there are variations in the shapes of the front casing 18, the flexible circuit board 40, and the sheet fixing member 42. In particular, in the case of this embodiment, the grounding terminal 40d of the flexible circuit board 40 and the front casing 18 can be electrically connected normally. This is because the second portion 42b of the sheet fixing member 42 is displaceable relative to the first portion 42a.

For specific description, a comparative example will be given in which the second portion 42b of the sheet fixing member 42 does not displace with respect to the first portion 42a, for example, in which the sheet fixing member 42 is a rigid body.

First, in the case of the comparative example, the distance between the contact surface 42d of the sheet fixing member 42 and the attachment surface 18b of the front casing 18 needs to be substantially equal to the thickness of the portion of the flexible circuit board 40 having the grounding terminal 40d.

Hence, since in the case of the comparative example, the plurality of contact surfaces 42e of the sheet fixing member 42 lie on the same plane, each of the plurality of corresponding attachment surfaces 18c of the front casing 18 needs to be first fabricated to lie on the same plane. In addition, the plurality of attachment surfaces 18c need to be each fabricated so that when they are in contact with the plurality of corresponding contact surfaces 42e of the sheet fixing member 42, the distance between the contact surface 42d and the attachment surface 18b becomes substantially equal to the thickness of the portion of the flexible circuit board 40 having the grounding terminal 40d. Therefore, in the case of the comparative example, the plurality of attachment surfaces 18b and 18c of the front casing 18 need to be fabricated with high precision in terms of positional relationship.

In contrast, in the case of this embodiment, the second portion 42b of the sheet fixing member 42 is displaceable with respect to the first portion 42a. Accordingly, it is no longer necessary to fabricate the plurality of attachment surfaces 18b and 18c of the front casing 18 with high precision in terms of positional relationship, taking into account the distance between the attachment surface 18b of the front casing 18 and the contact surface 42d of the sheet fixing member 42. In other words, the attachment surface 18b corresponding to the contact surface 42d on the second portion 42b of the sheet fixing member 42 and the attachment surfaces 18c corresponding to the plurality of contact surfaces 42e on the first portion 42a can be fabricated without high precision positioning with respect to each other. That is, even if the plurality of attachment surfaces 18b and 18c of the front casing 18 have variations in terms of positional relationship, the second portion 42b of the sheet fixing member 42 is displaced so that the contact surface 42d of the second portion 42b can come into normal contact with the attachment surface 18b via the flexible circuit board 40. As used herein, normal contact refers to a state ensuring uniform surface contact with a proper contact pressure. As a result, the grounding terminal 40d of the flexible circuit board 40 is normally electrically connected to the attachment surface 18b of the front casing 18.

According to this embodiment as described above, the sheet fixing member 42 can be normally fixed to the plurality of attachment surfaces 18b and 18c of the front casing 18 even if there are variations in shape.

Although the embodiment of the present disclosure has been described hereinabove by citing the above embodiment, the embodiment of the present disclosure is not limited thereto.

For example, in the case of the above embodiment, as shown in FIGS. 10 and 11, the second portion 42b of the sheet fixing member 42 is connected to the first portion 42a via one connecting portion 42c. However, the embodiment of the present disclosure is not limited thereto. The second portion may be connected to the first portion via a plurality of connecting portions.

In the case of the above embodiment, the sheet-like member fixed to the front casing 18 by the sheet fixing member 42 is the flexible circuit board 40. However, the embodiment of the present disclosure is not limited thereto. The sheet-like member may be, for example, a heat conductive sheet that thermally connects a heat generation source (for example, an IC chip on a control board) and the front casing.

Furthermore, in the case of the above embodiment, as shown in FIGS. 6 and 7, the sheet fixing member 42 is fixed to the front casing 18 via the plurality of fixing screws 52. However, the embodiment of the present disclosure is not limited thereto. For example, in the case where the front casing and the sheet fixing member are fabricated from a resin material, the sheet fixing member may be fixed to the front casing via an adhesive. In this case, contact needs to be maintained between the plurality of attachment surfaces of the front casing and the plurality of contact surfaces of the sheet fixing member until the adhesive is completely cured.

That is, in broad terms, the imaging apparatus according to the embodiment of the present disclosure includes: a casing having first and second attachment surfaces; a sheet fixing member having first and second contact surfaces coming into contact with the first and second attachment surfaces, respectively; and a sheet-like member disposed between the casing and the sheet-fixing member, the sheet fixing member including a first portion and a second portion displaceable relative to the first portion, the first contact surface of the sheet fixing member disposed on the first portion, the second contact surface of the sheet fixing member disposed on the second portion.

As above, the above embodiment has been described as exemplification of techniques in the present disclosure. To that end, the drawings and the detailed description have been provided. Accordingly, the constituent elements described in the drawings and the detailed description may include not only constituent elements essential for solving the problem but also constituent elements not essential for solving the problem, for the purpose of exemplifying the above techniques. Hence, those unessential constituent elements should not be construed as essential directly from the fact that those unessential constituent elements are described in the drawings and the detailed description.

Since the above embodiment is for the purpose of exemplifying the techniques in the present disclosure, various changes, permutations, additions, omissions, etc. may be made within the scope of claims or their equivalents.

The present disclosure is applicable to an imaging apparatus that requires a member on one hand to be in contact with a plurality of attachment surfaces on at least one member on the other.

What is claimed is:

1. An imaging apparatus comprising:
a casing having first and second attachment surfaces;
a sheet fixing member having first and second contact surfaces coming into contact with the first and second attachment surfaces, respectively; and
a sheet-like member disposed between the casing and the sheet-fixing member, wherein
the sheet fixing member including a first portion and a second portion displaceable relative to the first portion,
the first contact surface of the sheet fixing member disposed on the first portion,
the second contact surface of the sheet fixing member disposed on the second portion,
the sheet fixing member includes a connecting portion connecting the first portion and the second portion, and
the connecting portion is smaller in thickness than the first portion and the second portion in a direction in which the casing, the sheet fixing member, and the sheet-like member disposed therebetween are arranged.

2. The imaging apparatus according to claim 1, wherein the second contact surface of the sheet fixing member is in contact with the second attachment surface of the casing via a portion of the sheet-like member.

3. The imaging apparatus according to claim 2, wherein the casing is fabricated from a metallic material, wherein the sheet-like member is a flexible circuit board having a grounding terminal, and wherein the portion of the sheet-like member is the grounding terminal.

4. The imaging apparatus according to claim 3, further comprising:
a wireless communication unit connected to the sheet-like member to perform wireless communication with an external apparatus, wherein
the wireless communication unit is electrically connected to the casing via the grounding terminal of the sheet-like member.

5. An imaging apparatus comprising:
a casing having first and second attachment surfaces;
a sheet fixing member having first and second contact surfaces coming into contact with the first and second attachment surfaces, respectively; and a sheet-like member disposed between the casing and the sheet-fixing member, wherein the sheet fixing member including a first portion and a second portion displaceable relative to the first portion, the first contact surface of the sheet fixing member disposed on the first portion, the second contact surface of the sheet fixing member disposed on the second portion, the first and second attachment surfaces of the casing each have a threaded hole, the first and second contact surfaces of the sheet fixing member each have a through hole, and the imaging apparatus further comprises a fixing screw passing through the through hole of the sheet fixing member to engage with the threaded hole of the casing.

6. An imaging apparatus comprising:

a casing having first and second attachment surfaces;

a sheet fixing member having first and second contact surfaces coming into contact with the first and second attachment surfaces, respectively;

a sheet-like member disposed between the casing and the sheet-fixing member and an operation button supported by the casing in an advanceable and retractable manner, wherein the sheet fixing member including a first portion and a second portion displaceable relative to the first portion, the first contact surface of the sheet fixing member disposed on the first portion, the second contact surface of the sheet fixing member disposed on the second portion, and the sheet-like member is a flexible circuit board having a switch to be pressed by the operation button.

* * * * *